United States Patent
Mita et al.

(10) Patent No.: US 11,839,936 B2
(45) Date of Patent: Dec. 12, 2023

(54) SHEET FOR SINTERING BONDING AND SHEET FOR SINTERING BONDING WITH BASE MATERIAL

(71) Applicant: NITTO DENKO CORPORATION, Ibaraki (JP)

(72) Inventors: Ryota Mita, Ibaraki (JP); Tomoaki Ichikawa, Ibaraki (JP)

(73) Assignee: NITTO DENKO CORPORATION, Ibaraki (JP)

(*) Notice: Subject to any disclaimer, the term of this patent is extended or adjusted under 35 U.S.C. 154(b) by 797 days.

(21) Appl. No.: 16/818,088

(22) Filed: Mar. 13, 2020

(65) Prior Publication Data

US 2020/0290160 A1 Sep. 17, 2020

(30) Foreign Application Priority Data

Mar. 15, 2019 (JP) ................................. 2019-047962

(51) Int. Cl.
 *B32B 5/16* (2006.01)
 *B23K 35/24* (2006.01)
 (Continued)

(52) U.S. Cl.
 CPC ............ *B23K 35/24* (2013.01); *B23K 26/702* (2015.10); *B32B 5/16* (2013.01); *B32B 2260/025* (2013.01);
 (Continued)

(58) Field of Classification Search
 None
 See application file for complete search history.

(56) References Cited

U.S. PATENT DOCUMENTS

2018/0269175 A1\* 9/2018 Sugo .................. C09J 11/04
2019/0043824 A1 2/2019 Sugo et al.
(Continued)

FOREIGN PATENT DOCUMENTS

CN 108174617 A 6/2018
CN 108184331 A 6/2018
(Continued)

OTHER PUBLICATIONS

Notice of Reasons for Refusal dated Aug. 30, 2022 from the Japanese Patent Office in JP Application No. 2019-047962.
(Continued)

*Primary Examiner* — Xiaobei Wang
(74) *Attorney, Agent, or Firm* — Sughrue Mion, PLLC

(57) ABSTRACT

To provide a sheet for sintering bonding and the same with a base material suited for lamination and integration and also suited for realizing satisfactory operational efficiency in a sintering process in a process of producing semiconductor devices that go through sintering bonding of semiconductor chips. A sheet for sintering bonding 10 of the present invention comprises an electrically conductive metal containing sinterable particle and a binder component. In this sheet, the minimum load, reached during an unloading process in load-displacement measurement according to a nanoindentation method, is −100 to −30 μN. Alternatively, the ratio of the minimum load to a maximum load, reached during a load applying process in the above measurement, is −0.2 to −0.06. A sheet body X, a sheet for sintering bonding with a base material of the present invention, has a laminated structure comprising a base material B and the sheet 10.

20 Claims, 5 Drawing Sheets

(51) Int. Cl.
  *B23K 26/70* (2014.01)
  *H01L 21/48* (2006.01)
(52) U.S. Cl.
  CPC ... *B32B 2260/046* (2013.01); *B32B 2264/105* (2013.01); *B32B 2307/536* (2013.01); *H01L 21/4814* (2013.01)

(56) References Cited

U.S. PATENT DOCUMENTS

2019/0184460 A1* 6/2019 Honda ................. B32B 27/285
2020/0048504 A1   2/2020 Sugo et al.

FOREIGN PATENT DOCUMENTS

| EP | 3 434 398 A1 | 1/2019 | | |
|----|---|---|---|---|
| JP | 2013-39580 A | 2/2013 | | |
| JP | 2014-111800 A | 6/2014 | | |
| JP | 2017-69560 A | 4/2017 | | |
| WO | 2018/042772 A1 | 3/2018 | | |
| WO | WO-2018042772 A1 * | 3/2018 | ................ | B22F 3/02 |
| WO | 2018/179796 A1 | 10/2018 | | |

OTHER PUBLICATIONS

Menčík, "Low-Load Nanoindentation: Influence of Surface Forces and Adhesion", Chem. Listy, vol. 106, 2012, pp. s481-s484.
Extended European Search Report dated Aug. 11, 2020 by the European Patent Office in application No. 20162361.8.
Decision to Grant dated Nov. 29, 2022 issued by the Japanese Patent Office in Japanese Application No. 2019-047962.
First Office Action dated Oct. 21, 2022 issued by the Chinese Patent Office in Chinese Application No. 202010172512.1.

* cited by examiner

[Fig. 1]
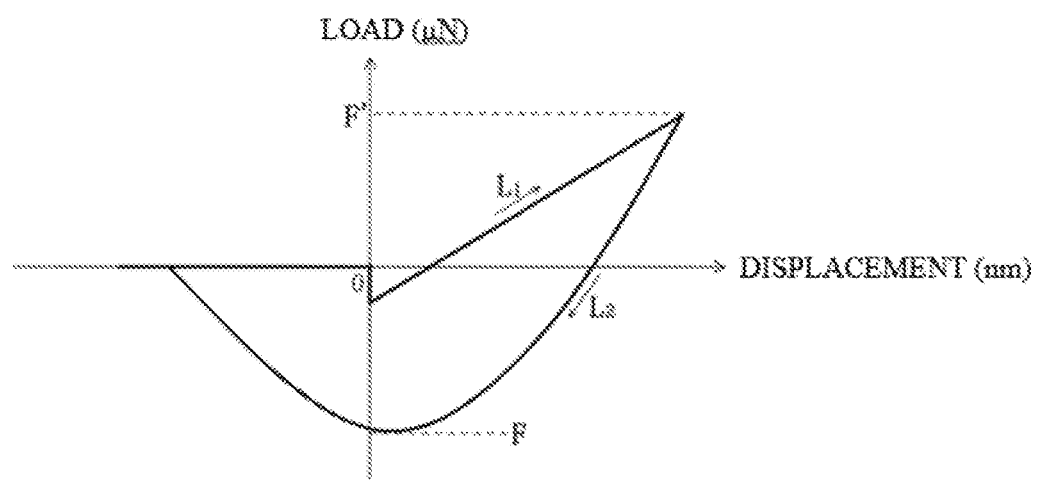
[Fig. 2]
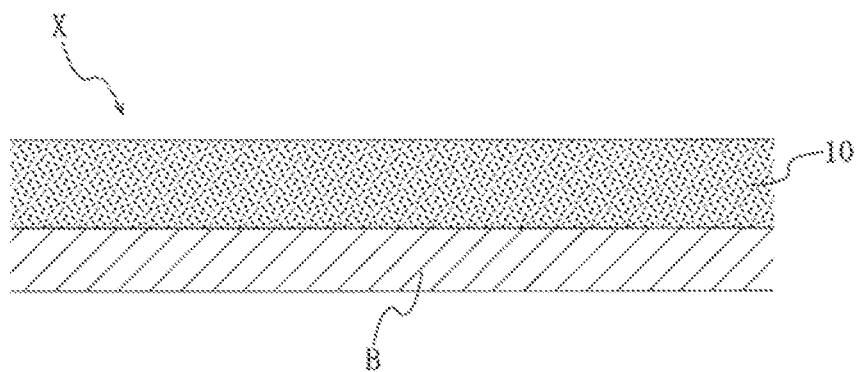

[Fig. 3(a)]
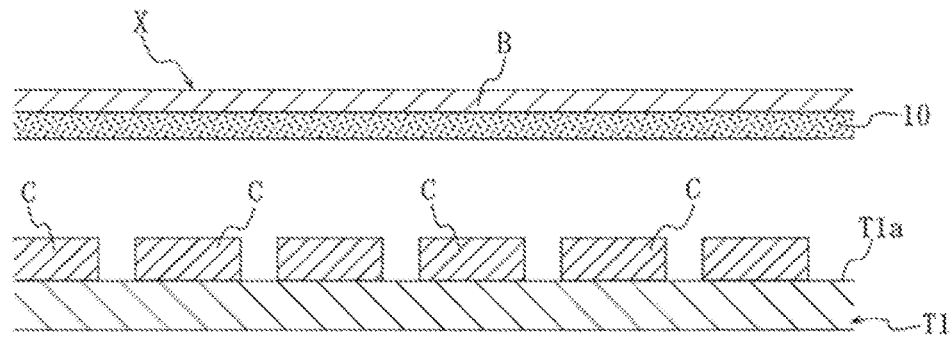
[Fig. 3(b)]
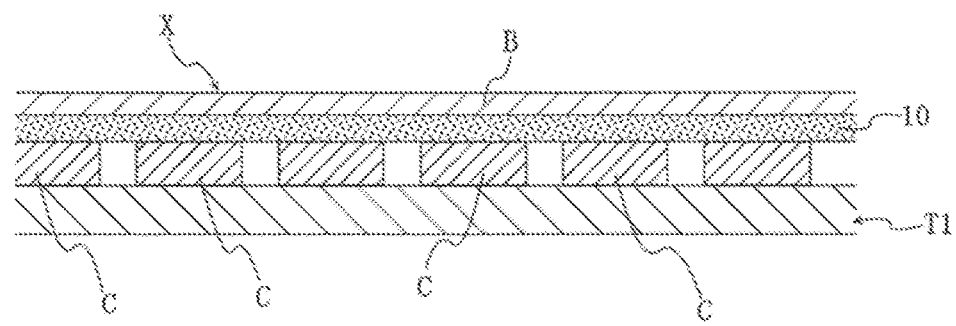
[Fig. 3(c)]
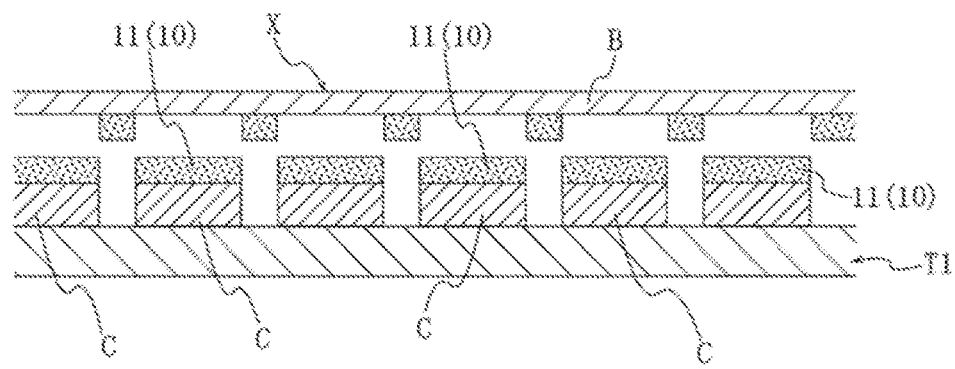

[Fig. 4]
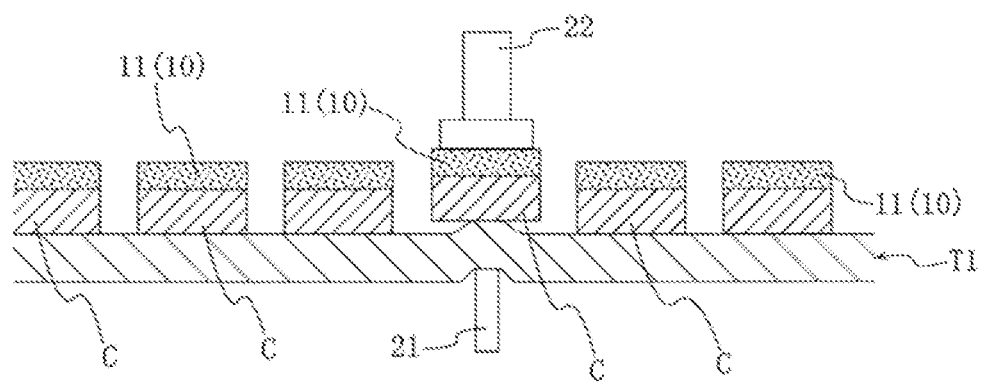
[Fig. 5]
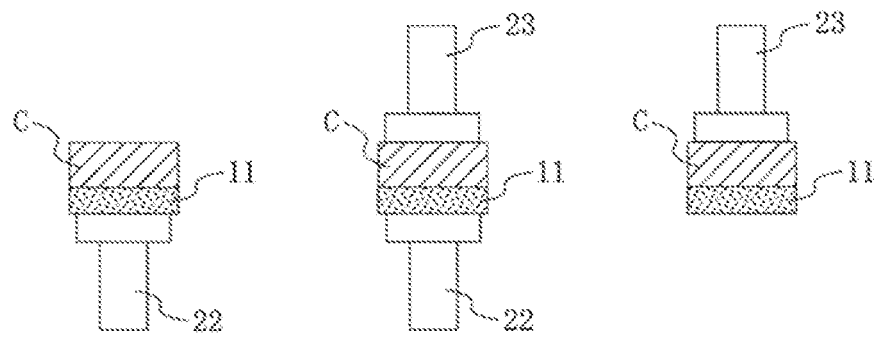

[Fig. 6(a)]
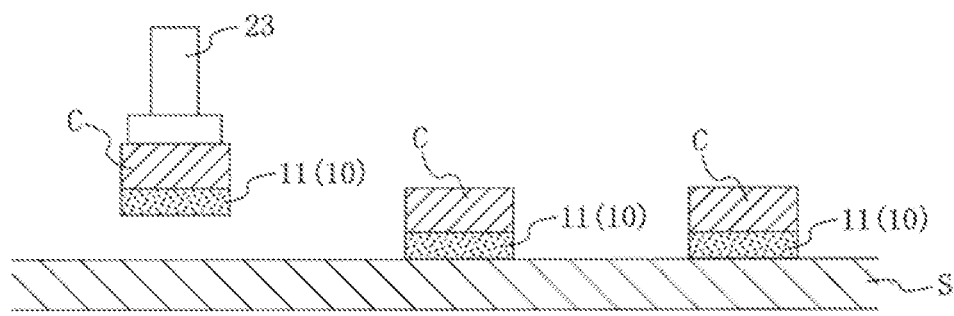
[Fig. 6(b)]
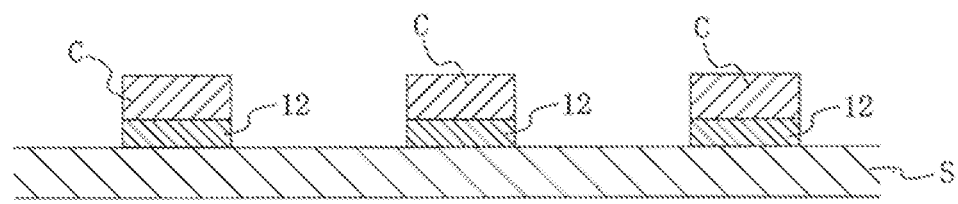

[Fig. 7(a)]
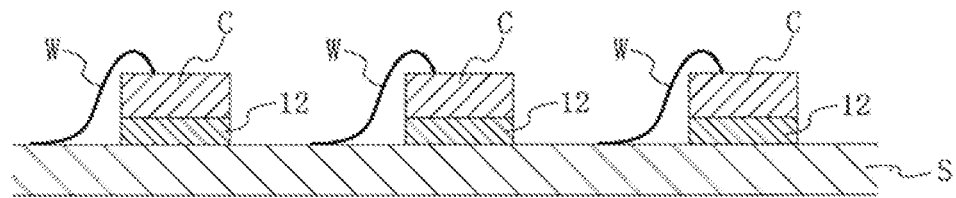
[Fig. 7(b)]
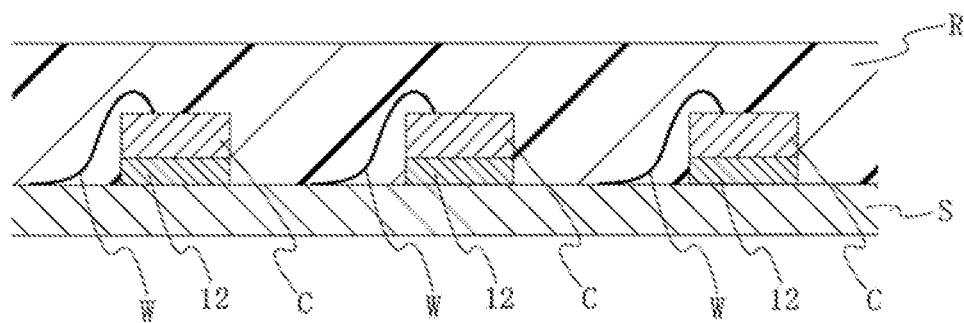

SHEET FOR SINTERING BONDING AND SHEET FOR SINTERING BONDING WITH BASE MATERIAL

TECHNICAL FIELD

The present invention relates to a sheet for sintering bonding that can be used for producing semiconductor devices and the like, and a sheet for sintering bonding accompanied by a base material.

BACKGROUND ART

In production of semiconductor devices, as a technique for die bonding a semiconductor chip to a supporting substrate, such as a lead frame or an insulating circuit substrate, while making an electrical connection with the side of the supporting substrate, a technique for forming a Au—Si eutectic alloy layer between the supporting substrate and the chip to realize a bonded state, or a technique for utilizing solder or an electrically conductive particle containing resin as a bonding material have been known.

Meanwhile, the spread of power semiconductor devices playing a role of controlling power supply has been remarkable in recent years. Power semiconductor devices often generate a large amount of heat due to a large amount of energization upon operation. Therefore, in production of power semiconductor devices, with respect to the technique for die bonding a semiconductor chip to a supporting substrate while making an electrical connection with the side of supporting substrate, it is desired to be able to realize a bonded state with high reliability even upon operation at high temperature. Such a demand is particularly strong in a power semiconductor device in which SiC or GaN is employed as a semiconductor material, attempting operation at a higher temperature. In order to meet such a demand, as a die bonding technique involving an electrical connection, a technology for using a composition for sintering bonding, containing a sinterable particle, a solvent and the like, has been proposed.

In the die bonding that is carried out using a sinterable particle containing material for sintering bonding, at first, a semiconductor chip is mounted onto a portion of the supporting substrate to which the chip is planned to be bonded via the material for sintering bonding under predetermined temperature and load conditions. Thereafter, a heating step is carried out under predetermined temperature and pressurization conditions such that volatilization of the solvent and the like in the material for sintering bonding occurs between the supporting substrate and the semiconductor chip thereon, and sintering between sinterable particles proceeds. Due to this, a sintered layer is formed between the supporting substrate and the semiconductor chip, and the semiconductor chip is mechanically bonded to the supporting substrate while making an electrical connection. Such a technique is described in, for example, the following Patent Literatures 1 and 2.

CITATION LIST

Patent Literature

Patent Literature 1
    Japanese Patent Laid-Open No. 2013-039580
Patent Literature 2
    Japanese Patent Laid-Open No. 2014-111800

SUMMARY OF INVENTION

Technical Problem

In a process of producing a semiconductor device in which die bonding is performed by sintering bonding, conventionally, a pasty, sinterable particle containing composition may be applied to every semiconductor chip. However, such a technique is not efficient.

On the other hand, in the process of producing a semiconductor device in which die bonding is performed by sintering bonding, in order to collectively supply a material for sintering bonding to a plurality of semiconductor chips, it is believed that the processes as described below are gone through, for example. At first, a plurality of semiconductor chips is arranged on a tape for processing having an adhesive face on one side or the adhesive face thereof. Next, a sheet for sintering bonding, which is a material for sintering bonding made into the form of a sheet, is pressed against the semiconductor chip array on the tape for processing, thereby laminating them. Next, while leaving the portions of the sheet for sintering bonding that have been pressure-bonded to the semiconductor chips on those semiconductor chips, separation of that sheet body is carried out. Through the lamination and the subsequent separation of that sheet body, in a case where transfer of the material for sintering bonding from the sheet body to each semiconductor chip is carried out, (that is, in a case where a small piece of the sheet for sintering bonding cut apart from the surroundings occurs on the semiconductor chip), a semiconductor chip with a layer of the material for sintering bonding is obtained (a transfer step). In such a transfer step, it is possible to collectively supply a material for sintering bonding to a plurality of semiconductor chips.

In the process of producing a semiconductor device in which die bonding is performed by sintering bonding, the semiconductor chip with the layer of the material for sintering bonding is pressure-bonded to a substrate via that layer of the material for sintering bonding, and is fixed temporarily (a temporary fixation step). Then, a sintered layer is formed through a heating process from the layer of the material for sintering bonding intervening between the temporarily fixed semiconductor chip and the substrate, and that semiconductor chip is thus sintering-bonded to the substrate.

However, in such a temporary fixation step, conventionally, there are some cases where chip shift, that is, position aberration in the semiconductor chip temporarily fixed to the substrate occurs. Such occurrence of position aberration is not preferable from the viewpoint of the efficiency of a series of the processes for sintering bonding, and is not preferable from the viewpoint of producing a semiconductor device comprising sintering bonding portions of semiconductor chips at a high yield.

In addition, upon making the sheet for sintering bonding as mentioned above, there are also some cases where it is necessary to employ a technique for obtaining a sheet for sintering bonding with a predetermined thickness by making with a good thickness accuracy a plurality of sheets for sintering bonding having a predetermined thinner thickness, and then laminating and integrating these thin sheets for sintering bonding into the sheet for sintering bonding with a predetermined thickness. However, conventionally, there are some cases where a plurality of laminated thin sheets for sintering bonding is not integrated sufficiently, and a thick sheet for sintering bonding cannot be obtained.

The present invention was thought out under the circumstances as described above, and an object of the present invention is to provide a sheet for sintering bonding and a sheet for sintering bonding with a base material that are suited for lamination and integration and that are also suited for realizing a satisfactory operational efficiency in the sintering process in the process of producing a semiconductor device comprising sintering bonding portions of semiconductor chips.

Solution to Problem

According to the first aspect of the present invention, a sheet for sintering bonding is provided. This sheet for sintering bonding comprises an electrically conductive metal containing sinterable particle and a binder component. Along with this, in the sheet for sintering bonding, the minimum load F, which is reached during an unloading process in load-displacement measurement in accordance with a nanoindentation method, is −100 to −30 µN. The nanoindentation method is a technology for measuring a variety of physical properties of a sample in the nanometer scale, and in this method, a process of pushing an indenter into a sample set on a stage (a load applying process) and a subsequent process of drawing the indenter out of the sample (an unloading process) are at least performed. During a series of the processes, the load exerted between the indenter and the sample, and the relative displacement of the indenter to the sample are measured, and the load-displacement curve can be obtained. From this load-displacement curve, with respect to the measurement sample, physical properties thereof such as hardness, elastic modulus, and adhesive strength can be determined based on the nanometer scale measurement. The load-displacement measurement by the nanoindentation method in the present invention can be carried out by using a nanoindenter (trade name: "Triboindenter", manufactured by Hysitron, Inc.). In that measurement, the measurement mode is single indentation measurement, the measurement temperature is 23° C., the indenter to be used is a Berkovich (trigonal pyramid) diamond indenter, the maximum load (set value), which is reached during the load applying process, is 500 µN, the indentation velocity of the indenter during the load applying process is 100 µN/sec, and the drawing velocity of the indenter during the unloading process is 100 µN/sec. FIG. 1 is a graph representing one example of the load-displacement curve obtained by the nanoindentation method. In the graph of FIG. 1, the horizontal axis represents a displacement of the indenter (nm), and the vertical axis represents a load exerted on the indenter (µN). For the displacement of the indenter, the indentation length of the indenter based on the surface of the measurement sample is expressed as a positive value. The load-displacement curve in FIG. 1 includes a line showing the load applying process $L_1$, during which the load is gradually increased, and another line showing the unloading process $L_2$, during which the load is gradually decreased. When the load exerted on the indenter has a negative value, it means that the indenter receives a tensile force due to the adhesive strength of the sample surface. In addition, F (µN) as the above minimum load and F' (µN) as the maximum load are shown in FIG. 1.

For example, the sheet for sintering bonding having the above configuration according to the first aspect of the present invention is used in the production process of a semiconductor device comprising sintering bonding portions of semiconductor chips, as follows. At first, the present sheet for sintering bonding is pressed against a plurality of semiconductor chips arranged on a tape for processing having an adhesive face on one side or the adhesive face thereof, thereby laminating them. Next, while leaving the portions of the sheet for sintering bonding that have been pressure-bonded to the semiconductor chips on those semiconductor chips, a separation operation of that sheet body is carried out. Through such lamination operation and subsequent separation operation, transfer of the material for sintering bonding from the sheet for sintering bonding to each semiconductor chip is carried out, and a layer of the material for sintering bonding, which is a small piece of the sheet for sintering bonding cut apart from the surroundings, occurs on the semiconductor chip (a transfer step). Next, the semiconductor chip with the layer of the material for sintering bonding is pressure-bonded to a substrate via that layer of the material for sintering bonding, and is fixed temporarily (a temporary fixation step). Then, a sintered layer is formed through a heating process from the layer of the material for sintering bonding intervening between the temporarily fixed semiconductor chip and the substrate, and that semiconductor chip is sintering-bonded to the substrate. As described above, it is possible to sintering-bond a semiconductor chip to a substrate by using the present sheet for sintering bonding, for example.

In the present sheet for sintering bonding, as mentioned above, the minimum load F, which is reached during an unloading process in load-displacement measurement in accordance with the nanoindentation method, is −100 to −30 µN. The present inventors have obtained a finding that, with respect to a sheet body of a composition containing an electrically conductive metal containing sinterable particle and a binder component, a configuration in which the above minimum load F is −100 to −30 µN is suited for obtaining a satisfactory adhesiveness between such a sheet for sintering bonding and the other object. For example, this is shown by Examples and Comparative Examples, which will be described later. In the present sheet for sintering bonding, the minimum load F, which is reached during an unloading process in load-displacement measurement in accordance with the nanoindentation method, is −30 µN or less (that is, the maximum tensile force exerted by the sheet for sintering bonding on the indenter drawn out of that sheet is 30 µN or more) is suitable from the viewpoint of obtaining high adhesive strength on the surface of the present sheet for sintering bonding. From the viewpoint of obtaining high adhesive strength on the surface of the sheet for sintering bonding, the minimum load F is preferably −32 µN or less, and more preferably −35 µN or less. On the other hand, in the present sheet for sintering bonding, a configuration in which the above minimum load F is −100 µN or more (that is, the maximum tensile force exerted by the sheet for sintering bonding on the indenter drawn out of that sheet is 100 µN or less) is suitable from the viewpoint of, in a case where, for example, the present sheet for sintering bonding is accompanied by a separating material such as a separator that covers the surface thereof, properly separating such a separating material from the present sheet for sintering bonding when necessary. With respect to the sheet for sintering bonding, from the viewpoint of ensuring such separability, the minimum load F is preferably −80 µN or more, and more preferably −65 µN or more.

The present sheet for sintering bonding, which is suited for obtaining a satisfactory adhesiveness, is suited for laminating and integrating a plurality thereof, and is thus suited for making a sheet for sintering bonding with a predetermined thickness by going through such lamination and integration.

In addition, the present sheet for sintering bonding, which is suited for obtaining a satisfactory adhesiveness, is suited for carrying out transfer of the material for sintering bonding to each semiconductor chip in the transfer step mentioned above in the process of producing a semiconductor device, that is, in the step for leaving the portions of the sheet for sintering bonding that have been pressure-bonded to the semiconductor chips on those semiconductor chips. That is, the present sheet for sintering bonding is suited for properly performing the transfer step mentioned above, in which the material for sintering bonding is collectively supplied to a plurality of semiconductor chips. Such a present sheet for sintering bonding is suited for realizing a satisfactory operational efficiency in the sintering process in the process of producing a semiconductor device comprising sintering bonding portions of semiconductor chips.

In addition, the present sheet for sintering bonding, which is suited for obtaining satisfactory adhesiveness, is suited for, in the temporary fixation step mentioned above in the process of producing a semiconductor device, that is, in the step for temporarily fixing a semiconductor chip with a layer of the material for sintering bonding to a substrate, suppressing occurrence of position aberration in such a semiconductor chip to be temporarily fixed. It is preferable that position aberration of the chip be suppressed in the temporary fixation step from the viewpoint of the efficiency of a series of the processes for sintering bonding. Accordingly, the present sheet for sintering bonding is suited for realizing a satisfactory operational efficiency in the sintering process in the process of producing a semiconductor device comprising sintering bonding portions of semiconductor chips.

As described above, the sheet for sintering bonding according to the first aspect of the present invention is suited for being laminated and integrated, and is also suited for realizing a satisfactory operational efficiency in the sintering process in the process of producing a semiconductor device comprising sintering bonding portions of semiconductor chips.

According to the second aspect of the present invention, a sheet for sintering bonding is provided. This sheet for sintering bonding comprises an electrically conductive metal containing sinterable particle and a binder component. Along with this, in the sheet for sintering bonding, the ratio (F/F') to the maximum load F', which is reached during a load applying process in load-displacement measurement in accordance with the nanoindentation method, of the minimum load F, which is reached during an unloading process subsequent to the load applying process, is −0.2 to −0.06. Such a sheet for sintering bonding can be used in the production process of a semiconductor device comprising sintering bonding portions of semiconductor chips, in the same manner as mentioned above with respect to the sheet for sintering bonding according to the first aspect.

In the present sheet for sintering bonding, as mentioned above, the ratio (F/F') to the maximum load F', which is reached during a load applying process in load-displacement measurement in accordance with the nanoindentation method, of the minimum load F, which is reached during an unloading process subsequent to the load applying process, is −0.2 to −0.06. The present inventors have obtained a finding that, with respect to a sheet body of a composition containing an electrically conductive metal containing sinterable particle and a binder component, a configuration in which the above ratio (F/F') is −0.2 to −0.06 is suited for obtaining a satisfactory adhesiveness between such a sheet for sintering bonding and the other object. For example, this is shown by Examples and Comparative Examples, which will be described later. In the present sheet for sintering bonding, a configuration in which the ratio (F/F') to the maximum load F', which is reached during the load applying process in load-displacement measurement in accordance with the nanoindentation method, of the minimum load F, which is reached during the unloading process, is −0.06 or less (that is, the ratio of the maximum tensile force exerted by the sheet for sintering bonding on the indenter drawn out of that sheet to the above maximum load is 0.06 or more) is suitable from the viewpoint of obtaining a high adhesive strength on the surface of the present sheet for sintering bonding. From the viewpoint of obtaining a high adhesive strength on the surface of the sheet for sintering bonding, the ratio is preferably −0.065 or less. On the other hand, in the present sheet for sintering bonding, a configuration in which the above ratio (F/F') is −0.2 or more (that is, the ratio of the maximum tensile force exerted by the sheet for sintering bonding on the indenter drawn out of that sheet to the above maximum load is 0.2 or less) is suitable from the viewpoint of, in a case where, for example, the present sheet for sintering bonding is accompanied by a separating material such as a separator that covers the surface thereof, properly separating such a separating material from the present sheet for sintering bonding when necessary. With respect to the sheet for sintering bonding, from the viewpoint of ensuring such separability, the ratio is preferably −0.15 or more.

The present sheet for sintering bonding, which is suited for obtaining a satisfactory adhesiveness, is suited for laminating and integrating a plurality thereof, and is thus suited for making a sheet for sintering bonding with a predetermined thickness by going through such lamination and integration.

In addition, the present sheet for sintering bonding, which is suited for obtaining a satisfactory adhesiveness, is suited for carrying out transfer of the material for sintering bonding to each semiconductor chip in the transfer step mentioned above in the process of producing a semiconductor device. That is, the present sheet for sintering bonding is suited for properly performing the transfer step mentioned above, in which the material for sintering bonding is collectively supplied to a plurality of semiconductor chips. Along with this, the present sheet for sintering bonding, which is suited for obtaining a satisfactory adhesiveness, is suited for, in the temporary fixation step mentioned above in the process of producing a semiconductor device, suppressing occurrence of position aberration in such a semiconductor chip to be temporarily fixed. It is preferable that position aberration of the chip be suppressed in the temporary fixation step from the viewpoint of the efficiency of a series of the processes for sintering bonding. Such a present sheet for sintering bonding, which is suited for properly performing the transfer step and the temporary fixation step, is suited for realizing a satisfactory operational efficiency in the sintering process in the process of producing a semiconductor device comprising sintering bonding portions of semiconductor chips.

As described above, the sheet for sintering bonding according to the second aspect of the present invention is suited for being laminated and integrated, and is also suited for realizing a satisfactory operational efficiency in the sintering process in the process of producing a semiconductor device comprising sintering bonding portions of semiconductor chips.

In the second aspect of the present invention, the above minimum load F in the sheet for sintering bonding is preferably −100 μN or more, more preferably −80 μN or more, and more preferably −65 μN or more. In addition, the above minimum load F in the sheet for sintering bonding according to the second aspect is preferably −30 μN or less, more preferably −32 μN or less, and more preferably −35 μN or less.

In the sheet for sintering bonding according to the first and second aspects of the present invention, the hardness H (GPa) and the minimum load F (μN), as determined from load-displacement measurement in accordance with the nanoindentation method, preferably satisfy −6000≤F/H≤−200. The hardness H (GPa) is a value obtained by dividing the maximum load F' mentioned above, which is reached during a load applying process in load-displacement measurement in accordance with the nanoindentation method, by the projected contact area at the time point where that maximum load is attained (that is, the projected contact area of the indenter used to the measurement sample). With respect to the sheet for sintering bonding, from the viewpoint of ensuring the separability mentioned above, the value of F/H is preferably −6000 or more, more preferably −4000 or more, more preferably −2000 or more, and more preferably −1500 or more, as described above. From the viewpoint of obtaining a satisfactory adhesiveness on the surface of the sheet for sintering bonding, the value of F/H is preferably −200 or less, more preferably −400 or less, and more preferably −600 or less, as described above.

In the sheet for sintering bonding according to the first and second aspects of the present invention, the hardness H, as determined from load-displacement measurement in accordance with the nanoindentation method, is preferably 0.02 to 0.1 GPa, more preferably 0.03 to 0.08 GPa, and more preferably 0.04 to 0.06 GPa. Such a configuration in the sheet for sintering bonding is suitable from the viewpoint of ensuring a moderate hardness, and is helpful for obtaining a satisfactory adhesiveness. Specifically, with respect to the sheet for sintering bonding, from the viewpoint of ensuring a "hardness" sufficient for retaining the sheet shape thereof, the hardness H is preferably 0.02 GPa or more, more preferably 0.03 GPa or more, and more preferably 0.04 GPa or more. In addition, with respect to the sheet for sintering bonding, from the viewpoint of ensuring a "stiffness" sufficient for avoiding a situation where the sheet is broken due to the fragility thereof, the hardness H is preferably 0.1 GPa or less, more preferably 0.08 GPa or less, and more preferably 0.06 GPa or less.

In the first and second aspects of the present invention, the binder component of the present sheet for sintering bonding preferably comprises a high molecular binder and/or a low molecular binder. In the sheet for sintering bonding, such a configuration is suitable from the viewpoint of adjusting various physical properties thereof, such as elastic modulus and adhesive strength.

In the first and second aspects of the present invention, when the sheet for sintering bonding comprises a high molecular binder, such a high molecular binder preferably comprises a thermally decomposable high molecular binder. In the present invention, the thermally decomposable high molecular binder refers to a binder component that can be thermally decomposed during the heating process at high temperature for sintering bonding. According to such a configuration, at a temperature for the temporary fixation mentioned above, for example, at 70° C., and in the temperature range close thereto, by utilizing the viscoelasticity of the thermally decomposable high molecular binder, the cohesive strength of the present sheet for sintering bonding or a layer of the material for sintering bonding derived therefrom is likely to be ensured, and accordingly, the adhesive strength of such a sheet or such a layer is likely to be ensured. As such, the present configuration is suitable from the viewpoint of, upon or after pressure-bonding bonding objects in a state where the layer of the material for sintering bonding derived from the present sheet for sintering bonding intervenes between the bonding objects, suppressing occurrence of position aberration in these bonding objects.

The weight average molecular weight of the high molecular binder, such as a thermally decomposable high molecular binder, in the sheet for sintering bonding is preferably 10000 or more. Such a configuration is suitable from the viewpoint of ensuring the cohesive strength or adhesive strength of the present sheet for sintering bonding or a layer of the material for sintering bonding derived therefrom by utilizing the viscoelasticity of the high molecular binder, such as a thermally decomposable high molecular binder.

The high molecular binder, such as a thermally decomposable high molecular binder, in the sheet for sintering bonding preferably comprises a polycarbonate resin and/or an acrylic resin. As mentioned above, in the process of using the present sheet for sintering bonding to realize sintering bonding, heating at high temperature for sintering bonding is carried out in a state where the bonding objects are temporarily fixed therebetween with the layer of the material for sintering bonding derived from the present sheet for sintering bonding. When the heating at high temperature for sintering bonding is carried out at, for example, 300° C. and in the temperature range including the vicinity thereof, a polycarbonate resin and an acrylic resin are easily provided as a high molecular binder that is decomposed and vaporized at a temperature of approximately 300° C. Accordingly, the present configuration is suitable from the viewpoint of reducing an organic residue in the sintered layer formed between the bonding objects to be sintering-bonded using the present sheet for sintering bonding. As the amount of the organic residue in the sintered layer becomes smaller, that sintered layer tends to be more rigid, and accordingly, high reliability for bonding is likely to be obtained in that sintered layer.

The low molecular binder in the sheet for sintering bonding preferably comprises a low boiling point binder having a boiling point lower than the thermal decomposition starting temperature of the thermally decomposable high molecular binder. Such a configuration is suited for ensuring satisfactory tackiness in the present sheet for sintering bonding, and is therefore suited for ensuring satisfactory adhesiveness to other members such as a semiconductor chip and a base material.

The proportion between the high molecular binder and the low molecular binder in the present sheet for sintering bonding (high molecular binder/low molecular binder) is, for example, 0.1 or more, preferably 0.15 or more, and more preferably 0.2 or more. In addition, the proportion is, for example, 1.4 or less, preferably 1.3 or less, more preferably 1.2 or less, and further preferably 1.1 or less. Such a configuration is suitable from the viewpoint of adjusting the minimum load F of the present sheet for sintering bonding, which is reached during an unloading process in load-displacement measurement in accordance with the nanoindentation method, and/or the ratio (F/F') of the minimum load F, which is reached during an unloading process subsequent to a load applying process in load-displacement measurement in accordance with the nanoindentation method, to the maximum load F', which is reached during the load applying process, in a predetermined range.

The above sinterable particle preferably comprises at least one selected from the group consisting of a silver particle, a copper particle, a silver oxide particle and a copper oxide particle. Such a configuration is suitable from the viewpoint of forming a rigid sintered layer between the bonding objects to be sintering-bonded using the present sheet for sintering bonding.

In the sheet for sintering bonding, the content of the above sinterable particle is preferably 60 to 99% by mass, more preferably 65 to 98% by mass, and more preferably 70 to 97% by mass. Such a configuration is suitable from the viewpoint of attempting to make the density of the sintered layer formed from the present sheet for sintering bonding higher.

According to the third aspect of the present invention, a sheet for sintering bonding with a base material is provided. This sheet for sintering bonding with a base material has a laminated structure comprising the sheet for sintering bonding mentioned above according to the first aspect of the present invention or the sheet for sintering bonding mentioned above according to the second aspect, and a base material. As such, the sheet for sintering bonding according to the present invention may be accompanied by a base material. Such a sheet for sintering bonding with a base material is easily handled, and according to the sheet for sintering bonding with a base material, for example, it is easy to perform the transfer step mentioned above in which the lamination operation and the subsequent separation operation are carried out.

BRIEF DESCRIPTION OF DRAWINGS

FIG. 1 represents one example of the load-displacement curve obtained by the nanoindentation method.

FIG. 2 is a partial schematic cross sectional drawing of a sheet for sintering bonding with a base material according to one embodiment of the present invention.

FIGS. 3(a)-(c) represents some steps of a method of producing a semiconductor device carried out by using the sheet for sintering bonding with a base material shown in FIG. 2.

FIG. 4 represents a step subsequent to the step shown in FIG. 3.

FIG. 5 represents a step subsequent to the step shown in FIG. 4.

FIGS. 6(a)-6(b) represents a step subsequent to the step shown in FIG. 5.

FIGS. 7(a)-7(b) represents a step subsequent to the step shown in FIG. 6.

DESCRIPTION OF EMBODIMENTS

FIG. 2 is a partial schematic cross sectional drawing of a sheet body X, which is a sheet for sintering bonding with a base material according to one embodiment of the present invention. The sheet body X has a laminated structure comprising a base material B and a sheet for sintering bonding 10 according to one embodiment of the present invention.

The base material B is an element that functions as a support in the sheet body X. The base material B is, for example, a plastic base material, and as such a plastic base material, a plastic film can be suitably used. Examples of the constituent material for the plastic base material include, for example, polyolefins, polyesters, polyurethanes, polycarbonates, polyetheretherketones, polyimides, polyetherimides, polyamides, wholly aromatic polyamides, polyvinyl chlorides, polyvinylidene chlorides, polyphenyl sulfides, aramids, fluororesins, cellulosic resins, and silicone resins. Examples of the polyolefin include, for example, low density polyethylenes, linear low density polyethylenes, medium density polyethylenes, high density polyethylenes, very low density polyethylenes, random copolymerized polypropylenes, block copolymerized polypropylenes, homopolypropylenes, polybutenes, polymethylpentenes, ethylene-vinyl acetate copolymers, ionomer resins, ethylene-(meth)acrylic acid copolymers, ethylene-(meth)acrylate ester copolymers, ethylene-butene copolymers, and ethylene-hexene copolymers. Examples of the polyester include, for example, polyethylene terephthalates, polyethylene naphthalates, and polybutylene terephthalates. The base material B may be formed of one kind of material, or may be formed of two or more kinds of materials. The base material B may have a single layer structure, or may have a multilayer structure. When the base material B is formed of a plastic film, such a base material B may be a nonoriented film, may be a uniaxially oriented film, or may be a biaxially oriented film. Alternatively, the base material B may be a pressure-sensitive adhesive tape or pressure-sensitive adhesive sheet, such as a dicing tape, having a layer of a pressure-sensitive adhesive forming an adhesive face on the side of the sheet for sintering bonding 10. That layer of a pressure-sensitive adhesive may be a layer of an ultraviolet curable pressure-sensitive adhesive, which is cured by ultraviolet irradiation, thereby decreasing the adhesive strength.

The sheet for sintering bonding 10 is a composition for sintering bonding having the shape of a sheet, at least comprising an electrically conductive metal containing sinterable particle and a binder component, the composition being used for sintering-bonding the bonding objects therebetween. The sheet for sintering bonding 10 may have a predetermined planar view shape, such as a circular shape or a rectangular shape, on the base material B. Alternatively, on a single base material, a plurality of sheets for sintering bonding 10 having predetermined planar view shapes may be provided.

The sinterable particle in the sheet for sintering bonding 10 is a particle that contains an electrically conductive metallic element and can be sintered. Examples of the electrically conductive metallic element include, for example, gold, silver, copper, palladium, tin, and nickel. Examples of the constituent material for such a sinterable particle include, for example, gold, silver, copper, palladium, tin, nickel, and an alloy of two or more kinds of metals selected from the group thereof. Examples of the constituent material for the sinterable particle also include metal oxides, such as silver oxide, copper oxide, palladium oxide, and tin oxide. In addition, the sinterable particle may be a particle having a core shell structure. For example, the sinterable particle may be a particle with a core shell structure, having a core mainly composed of copper and a shell mainly composed of gold or silver and covering the core. In the present embodiment, the sinterable particle preferably comprises at least one selected from the group consisting of a silver particle, a copper particle, a silver oxide particle and a copper oxide particle. Such a configuration is preferable from the viewpoint of forming a rigid sintered layer between the bonding objects to be sintering-bonded using the sheet for sintering bonding 10. Moreover, from the viewpoint of achieving high electrical conductivity and high thermal conductivity in a sintered layer to be formed, a silver particle and a copper particle are preferable as the sinterable particle. In addition, from the viewpoint of oxidation resistance, a silver particle is easily handled and is thus preferable. For example, in sintering bonding of a semiconductor chip to a copper substrate with silver plate, when a sintering material containing a copper particle as the sinterable particle is used, it is necessary to carry out the sintering process under an inert environment such as under a nitrogen atmosphere; however, when a sintering material in which a silver particle acts as the sinterable particle is used, the sintering process can be properly conducted even in an air atmosphere.

The average particle diameter of the sinterable particle to be used is preferably 10000 nm or less, more preferably 3000 nm or less, more preferably 1000 nm or less, and more preferably 500 nm or less from the viewpoint of ensuring the flatness of the surface of the sheet for sintering bonding 10. With respect to the sinterable particle in the sheet for sintering bonding 10 or the composition for forming the sheet, from the viewpoint of realizing satisfactory dispersibility, the average particle diameter of the sinterable particle is preferably 1 nm or more, more preferably 10 nm or more, and more preferably 50 nm or more. The average particle diameter of the sinterable particle can be measured by carrying out observation using a scanning electron microscope (SEM).

In the sheet for sintering bonding 10, the content of the sinterable particle is preferably 60 to 99% by mass, more preferably 65 to 98% by mass, and more preferably 70 to 97% by mass from the viewpoint of realizing sintering bonding with high reliability.

In the present embodiment, the binder component in the sheet for sintering bonding 10 at least comprises a high molecular binder and a low molecular binder, and may further comprise an additional component such as a plasticizer.

The high molecular binder in the sheet for sintering bonding is preferably a thermally decomposable high molecular binder. The thermally decomposable high molecular binder is a binder component that can be thermally decomposed during the heating process at high temperature for sintering bonding, and is an element that contributes to retention of the sheet shape of the sheet for sintering bonding 10 until the initiation of that heating process. In the present embodiment, from the viewpoint of securing a function of retaining the sheet shape, the thermally decomposable high molecular binder is a solid material at ordinary temperature (23° C.). Examples of such a thermally decomposable high molecular binder may include, for example, a polycarbonate resin and an acrylic resin. The thermally decomposable high molecular binder in the sheet for sintering bonding 10 preferably comprises a polycarbonate resin and/or an acrylic resin.

Examples of the above polycarbonate resin include, for example, aliphatic polycarbonates having a backbone of carboxylate ester groups (—O—CO—O—) not comprising an aromatic compound, such as a benzene ring, therebetween and formed of aliphatic chains, and aromatic polycarbonates having a backbone of carboxylate ester groups (—O—CO—O—) comprising an aromatic compound therebetween. Examples of the aliphatic polycarbonate include, for example, polyethylene carbonates and polypropylene carbonates. Examples of the aromatic polycarbonate include polycarbonates comprising a bisphenol A structure in the backbone thereof.

Examples of the above acrylic resin include, for example, polymers of an acrylate ester and/or a methacrylate ester having a linear or branched alkyl group having 4 to 18 carbon atoms. Hereinafter, "acrylic" and/or "methacrylic" are represented by "(meth)acrylic", and "acrylate" and/or "methacrylate" are represented by "(meth)acrylate".

Examples of the alkyl group of the (meth)acrylate ester forming an acrylic resin as the thermally decomposable high molecular binder include, for example, a methyl group, an ethyl group, a propyl group, an isopropyl group, a n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, and an octadecyl group.

The above acrylic resin may be a polymer comprising a monomer unit derived from an additional monomer other than the above (meth)acrylate ester. Examples of such an additional monomer include, for example, carboxy group containing monomers, acid anhydride monomers, hydroxy group containing monomers, sulfonic acid group containing monomers, and phosphoric acid group containing monomers. Specifically, examples of the carboxy group containing monomer include, for example, acrylic acid, methacrylic acid, carboxyethyl acrylate, carboxypentyl acrylate, itaconic acid, maleic acid, fumaric acid, and crotonic acid. Examples of the acid anhydride monomer include, for example, maleic anhydride and itaconic anhydride. Examples of the hydroxy group containing monomer include, for example, 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and 4-(hydroxymethyl)cyclohexylmethyl (meth)acrylate. Examples of the sulfonic acid group containing monomer include, for example, styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid. Examples of the phosphoric acid group containing monomer include, for example, 2-hydroxyethylacryloyl phosphate.

The weight average molecular weight of the high molecular binder or the thermally decomposable high molecular binder contained in the sheet for sintering bonding 10 is preferably 10000 or more. The weight average molecular weight of the thermally decomposable high molecular binder is defined to be a value obtained through measurement with gel permeation chromatography (GPC) and calculation in terms of polystyrene.

The content of the high molecular binder or the thermally decomposable high molecular binder contained in the sheet for sintering bonding 10 is preferably 0.1 to 20% by mass, more preferably 0.5 to 18% by mass, more preferably 1 to 15% by mass, further preferably 1 to 7% by mass, and particularly preferably 1 to 5% by mass from the viewpoint of properly exhibiting the function of retaining the sheet shape mentioned above.

The low molecular binder in the sheet for sintering bonding 10 is preferably a low boiling point binder. The low boiling point binder is a binder component having a boiling point lower than the thermal decomposition starting temperature of the high molecular binder such as a thermally decomposable high molecular binder. In the present embodiment, the low boiling point binder is defined to be liquid or semi-liquid, exhibiting a viscosity at 23° C. of $1 \times 10^5$ Pa·s or less, which is measured by using an apparatus for measuring dynamic viscoelasticity (trade name: "HAAKE MARS III", manufactured by Thermo Fisher Scientific K.K.). In the present viscosity measurement, 20 mmφ parallel plates are used as jigs, the gap between the plates is 100 μm, and the shear velocity in rotational shear is $1\ s^{-1}$.

Examples of the low boiling point binder mentioned above include, for example, terpene alcohols, alcohols excluding terpene alcohols, alkylene glycol alkyl ethers, and ethers excluding alkylene glycol alkyl ethers. Examples of the terpene alcohol include, for example, isobornyl cyclohexanol, citronellol, geraniol, nerol, carveol, and α-terpineol. Examples of the alcohol excluding terpene alcohols include, for example, pentanol, hexanol, heptanol, octanol, 1-decanol, ethylene glycol, diethylene glycol, propylene glycol, butylene glycol, and 2,4-diethyl-1,5-pentanediol. Examples of the alkylene glycol alkyl ether include, for example, ethylene glycol butyl ether, diethylene glycol methyl ether, diethylene glycol ethyl ether, diethylene glycol butyl ether, diethylene glycol isobutyl ether, diethylene glycol hexyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether. Examples of the ether excluding alkylene glycol alkyl ethers include, for example, ethylene glycol ethyl ether acetate, ethylene glycol butyl ether acetate, diethylene glycol ethyl ether acetate, diethylene glycol butyl ether acetate, and dipropylene glycol methyl ether acetate. As a component in the sheet for sintering bonding 10, one kind of low boiling point binder may be used, or two or more kinds of low boiling point binders may be used. The low boiling point binder in the sheet for sintering bonding 10 is preferably a terpene alcohol, and is more preferably isobornyl cyclohexanol from the viewpoint of stability at ordinary temperature.

The molecular weight of the low molecular binder is not particularly limited, and for example, it is 500 or less, preferably 450 or less, more preferably 400 or less, further preferably 350 or less, and particularly preferably 300 or less. In addition, the molecular weight of the low molecular binder is, for example, 50 or more, preferably 100 or more, more preferably 150 or more, and further preferably 200 or more.

The boiling point of the low boiling point binder is not particularly limited as long as it is lower than the thermal decomposition starting temperature of the high molecular binder such as a thermally decomposable high molecular binder, and for example, it is 500° C. or less, preferably 450° C. or less, more preferably 400° C. or less, and further preferably 350° C. or less. In addition, the boiling point of the low boiling point binder is, for example, 50° C. or more, preferably 100° C. or more, more preferably 150° C. or more, further preferably 200° C. or more, and particularly preferably 250° C. or more.

The content of the low molecular binder, such as a low boiling point binder, in the sheet for sintering bonding 10 is, for example, 1 to 50% by mass from the viewpoint of ensuring satisfactory tackiness on the surface of that sheet.

The proportion between the high molecular binder and the low molecular binder (low boiling point binder) in the sheet for sintering bonding 10 (high molecular binder/low molecular binder) is not particularly limited, and for example, it is 0.1 or more, preferably 0.15 or more, and more preferably 0.2 or more from the viewpoint of properly exhibiting the function of retaining the sheet shape of the sheet for sintering bonding 10. In addition, the proportion is, for example, 1.4 or less, preferably 1.3 or less, more preferably 1.2 or less, and further preferably 1.1 or less from the viewpoint of ensuring satisfactory tackiness and adhesiveness on the surface of that sheet. In addition, when such a configuration is in the above range, it is suitable from the viewpoint of adjusting the minimum load F of the sheet for sintering bonding 10, which is reached during an unloading process in load-displacement measurement in accordance with the nanoindentation method, and/or the ratio (F/F') of the minimum load F, which is reached during an unloading process subsequent to a load applying process in load-displacement measurement in accordance with the nanoindentation method, to the maximum load F', which is reached during the load applying process, in a predetermined range.

The thickness of the sheet for sintering bonding 10 at 23° C. is preferably not less than 5 μm, more preferably not less than 10 μm, and preferably not more than 300 μm, more preferably not more than 150 μm.

In the present embodiment, the sheet for sintering bonding 10 has a minimum load F, which is reached during an unloading process in load-displacement measurement in accordance with the nanoindentation method, of −100 to −30 μN. This minimum load F is preferably not less than −100 μN, more preferably not less than −80 μN, more preferably not less than −65 μN, and more preferably not less than −55 μN, and preferably not more than −30 μN, more preferably not more than −32 μN, and more preferably not more than −35 μN. Along with this, in the present embodiment, the sheet for sintering bonding 10 has a ratio (F/F') to the maximum load F', which is reached during a load applying process in load-displacement measurement in accordance with the nanoindentation method, of the minimum load F, which is reached during the unloading process subsequent to the load applying process, of −0.2 to −0.06. This ratio is preferably not less than −0.15 and preferably not more than −0.065. The load-displacement measurement by the nanoindentation method in the present invention can be carried out by using a nanoindenter (trade name: "Triboindenter", manufactured by Hysitron, Inc.) In that measurement, the measurement mode is single indentation measurement, the measurement temperature is 23° C., the indenter to be used is a Berkovich (trigonal pyramid) diamond indenter, the maximum load (set value), which is reached during the load applying process, is 500 μN, the indentation velocity of the indenter during the load applying process is 100 μN/sec, and the drawing velocity of the indenter during the unloading process is 100 μN/sec. For example, adjustment of the above minimum load F with respect to the sheet for sintering bonding 10 can be carried out by adjusting the respective amounts of the low molecular binder and the high molecular binder to be compounded in the sheet for sintering bonding 10, or by adjusting the viscoelasticity with respect to the low molecular binder.

In the sheet for sintering bonding 10, the hardness H, as determined from load-displacement measurement in accordance with the nanoindentation method, is preferably 0.02 to 0.1 GPa, and more preferably 0.03 to 0.08 GPa. The hardness H is a value obtained by dividing the maximum load F' mentioned above, which is reached during a load applying process in load-displacement measurement in accordance with the nanoindentation method, by the projected contact area at the time point where that maximum load is attained (that is, the projected contact area of the indenter used to the measurement sample).

In the sheet for sintering bonding 10, the hardness H (GPa) and the minimum load F (μN), as determined from load-displacement measurement in accordance with the nanoindentation method, preferably satisfy $-6000 \leq F/H \leq -$ 200. This value of F/H is preferably not less than −4000, more preferably not less than −2000, and more preferably not less than −1500, and preferably not more than −400, and more preferably not more than −600.

The sheet for sintering bonding 10 or the composition for sintering bonding forming this has a viscosity at 70° C. of, for example, $5 \times 10^3$ to $1 \times 10^7$ Pa·s, and preferably $1 \times 10^4$ to $1 \times 10^6$ Pa·s.

The sheet for sintering bonding 10 can be made by, for example, mixing the respective components mentioned above in a solvent to prepare a varnish, applying such a varnish on the base material B to form a coating film, and then drying that coating film. For the solvent for preparing a varnish, an organic solvent or an alcoholic solvent can be used.

FIGS. 3(*a*) 3 to FIG. 7(*b*) represent some steps of a method of producing a semiconductor device carried out by using the sheet body X or the sheet for sintering bonding 10 mentioned above. The present method is a method for producing a semiconductor device, such as a power semiconductor device comprising sintering bonding portions of semiconductor chips.

In the present method, at first, as shown in FIG. 3(*a*), the sheet body X having the sheet for sintering bonding 10 mentioned above, and a plurality of chips C are provided. Each of a plurality of chips C is a semiconductor chip in which a predetermined semiconductor element has already been fabricated. A plurality of chips C is arranged on an adhesive face T1*a* of a tape for processing T1, with a gap between the adjoining chips. Examples of the constituent material for forming the chip body of chips C include, for example, semiconductor materials for power semiconductor devices, such as silicon carbide (SiC) or gallium nitride (GaN). The thickness of the chip C is, for example, 20 to 1000 μm. In each chip C, an external electrode (not shown in the figure) has already been formed on the surface on the side to which the sheet for sintering bonding 10 is to be laminated (in FIG. 3, the top face in the figure). The external electrode is, for example, a silver planar electrode, and the thickness thereof is, for example, 10 nm to 1000 nm. A silver planar electrode as the external electrode may be laminated and formed on a titanium thin film that has been formed on the surface of the semiconductor chip. The thickness of that titanium thin film is, for example, 10 nm to 1000 nm. These silver planar electrode and titanium thin film can be formed through, for example, a vapor deposition method. In addition, on the other face of each chip C (in FIG. 3, the bottom face in the figure), another external electrode (not shown in the figure) has been formed, if necessary.

In the present method of producing a semiconductor device, next, a transfer step is carried out. In the transfer step, at first, as shown in FIG. 3(*b*), the side of the sheet for sintering bonding 10 of the sheet body X is pressure-bonded against a plurality of chips C on the tape for processing T1, thereby laminating them. Examples of the pressing means for the lamination include, for example, a pressure roller. The lamination temperature is, for example, in the range from room temperature to 200° C. The load for the lamination is, for example, 0.01 to 10 MPa. After the lamination, as shown in FIG. 3(*c*), while leaving a part of the sheet for sintering bonding 10 on the side of the chip C, a separation operation of the base material B is carried out. Through such lamination operation and subsequent separation operation, transfer of the material for sintering bonding from the sheet for sintering bonding 10 to each chip C is carried out, and a layer of the material for sintering bonding 11, which is a small piece of the sheet for sintering bonding cut apart from the surroundings, occurs on the chip C. In the present step, the material for sintering bonding can be collectively supplied to every chip C.

In the present method of producing a semiconductor device, next, as shown in FIG. 4, the chip C is picked up from the tape for processing T1 along with the part in the sheet for sintering bonding 10 that has been closely adhered to the chip C, thereby obtaining a chip C accompanied by the layer of the material for sintering bonding 11 (a picking up step). In the picking up step of the present embodiment, specifically, the chip C to be picked up is pushed up via the tape for processing T1 by raising a pin member 21 of a picking up mechanism at the lower side of the tape for processing T1 in the figure. After such pushing up, the chip C is adsorbed to and retained by an adsorption collet 22 through an adsorptive action to the side of the layer of the material for sintering bonding 11. As such, the picking up of the chip C with the layer of the material for sintering bonding 11 can be carried out.

In the present embodiment, next, as shown in FIG. 5, the chip C with the layer of the material for sintering bonding is delivered from the adsorption collet 22 that has picked up the chip C to another adsorption collet 23. The adsorption collet 23 retains the chip C through an adsorptive action to the side of the chip of the chip C with the layer of the material for sintering bonding.

Next, as shown in FIG. 6(*a*), the chip C with the layer of the material for sintering bonding is pressure-bonded to a supporting substrate S via that layer of the material for sintering bonding 11, and is fixed temporarily (a temporary fixation step). Specifically, the chip C with the layer of the material for sintering bonding is pressed against the supporting substrate S via that layer of the material for sintering bonding 11 by, for example, using a chip mounter, and is fixed temporarily. Examples of the supporting substrate S include, for example, an insulating circuit substrate accompanied by a wiring such as a copper wiring on the surface thereof, and a lead frame. The portion of the supporting substrate S, on which the chip is mounted, may be the bare surface of a copper wiring or a lead frame, or may be the surface of a plated film formed on the bare surface. Examples of such a plated film include, for example, a gold plated film, a silver plated film, a nickel plated film, a palladium plated film, and a platinum plated film. In the present step, the temperature conditions for the temporary fixation are, for example, in the range from room temperature to 300° C., the load with respect to the pressing is, for example, 0.01 to 50 MPa, and the bonding time is, for example, 0.01 to 300 seconds.

Next, as shown in FIG. 6(*b*), a sintered layer 12 is formed through a heating process from the layer of the material for sintering bonding 11 intervening between the temporarily fixed chip C and the supporting substrate S, and the chip C is sintering-bonded to the supporting substrate S (a sintering bonding step). Specifically, by going through a predetermined heating process at high temperature, the low molecular binder in the layer of the material for sintering bonding 11 is volatilized between the supporting substrate S and the chip C, and all of or a part of the high molecular binder is thermally decomposed and vaporized, if necessary, and then, the electrically conductive metal of the sinterable particle is sintered. Due to this, the sintered layer 12 is formed between the supporting substrate S and the chip C, and the chip C is bonded to the supporting substrate S while making an electrical connection with the side of supporting substrate S. In the present step, the temperature conditions for the sintering bonding are, for example, in the range of 150 to 400° C. The pressure for the sintering bonding is, for example, 60 MPa or less. In addition, the bonding time of the sintering bonding is, for example, 0.3 to 300 minutes. For example, within the range of these conditions, the temperature profile and the pressure profile for performing the sintering bonding step are appropriately set. The sintering bonding step as described above can be carried out by using an apparatus that can carry out heating and pressurization at the same time. Examples of such an apparatus include, for example, a flip chip bonder and a parallel plate pressing machine. In addition, from the viewpoint of preventing oxidation of the metal that is involved in the sintering bonding, it is preferable that the present step be carried out under a nitrogen atmosphere, under reduced pressure, or under a reducing gas atmosphere.

In the present method of producing a semiconductor device, next, as shown in FIG. 7(a), an electrode part (not shown in the figure) of the chip C and a terminal part (not shown in the figure) that the supporting substrate S has are electrically connected via a bonding wire W, if necessary (a wire bonding step). The wire connection between the electrode part of the chip C or the terminal part of the supporting substrate S and the bonding wire W is realized through, for example, ultrasonic welding involving heating. As the bonding wire W, for example, a gold wire, an aluminum wire, or a copper wire can be used. The wire heating temperature in the wire bonding is, for example, 80 to 250° C. In addition, the heating time thereof is, for example, a few seconds to a few minutes.

Next, as shown in FIG. 7(b), a sealing resin R is formed for protecting the chip C and the bonding wire W on the supporting substrate S (a sealing step). In the present step, for example, the sealing resin R is formed through a transfer mold technology, which is carried out by using a metal mold. As the constituent material for the sealing resin R, for example, an epoxy resin can be used. In the present step, the heating temperature for forming the sealing resin R is, for example 165 to 185° C., and the heating time is, for example, 60 seconds to a few minutes. When curing of the sealing resin R does not proceed sufficiently in the present sealing step, after the present step, a subsequent curing step is carried out for completely curing the sealing resin R.

As described above, a semiconductor device comprising sintering bonding portions of semiconductor chips can be produced.

In the sheet for sintering bonding 10, as mentioned above, the minimum load F, which is reached during an unloading process in load-displacement measurement in accordance with the nanoindentation method, is −100 to −30 µN, or the ratio (F/F') to the maximum load F', which is reached during a load applying process in the load-displacement measurement, of the minimum load F, which is reached during the unloading process subsequent to the load applying process, is −0.2 to −0.06.

The present inventors have obtained a finding that, with respect to a sheet body of a composition containing an electrically conductive metal containing sinterable particle and a binder component, a configuration in which the above minimum load F is −100 to −30 µN is suited for obtaining a satisfactory adhesiveness between such a sheet for sintering bonding 10 and the other object. For example, this is shown by Examples and Comparative Examples, which will be described later. In the sheet for sintering bonding 10, a configuration in which the minimum load F, which is reached during an unloading process in load-displacement measurement in accordance with the nanoindentation method, is −30 µN or less (that is, the maximum tensile force exerted by the sheet for sintering bonding 10 on the indenter drawn out of that sheet is 30 µN or more) is suitable from the viewpoint of obtaining high adhesive strength on the surface of the sheet for sintering bonding 10. From the viewpoint of obtaining high adhesive strength on the surface of the sheet for sintering bonding 10, the minimum load F is preferably −32 µN or less, and more preferably −35 µN or less. On the other hand, in the sheet for sintering bonding 10, a configuration in which the above minimum load F is −100 µN or more (that is, the maximum tensile force exerted by the sheet for sintering bonding 10 on the indenter drawn out of that sheet is 100 µN or less) is suitable from the viewpoint of, in a case where, for example, the sheet for sintering bonding 10 is accompanied by a separating material such as a separator that covers the surface thereof, properly separating such a separating material from the sheet for sintering bonding 10 when necessary. With respect to the sheet for sintering bonding 10, from the viewpoint of ensuring such separability, the minimum load F is preferably −80 µN or more, and more preferably −65 µN or more.

The present inventors have obtained a finding that, with respect to a sheet body of a composition containing an electrically conductive metal containing sinterable particle and a binder component, a configuration in which the above ratio (F/F') is −0.2 to −0.06 is suited for obtaining a satisfactory adhesiveness between such a sheet for sintering bonding 10 and the other object. For example, this is shown by Examples and Comparative Examples, which will be described later. In the sheet for sintering bonding 10, a configuration in which the ratio (F/F') to the maximum load F', which is reached during a load applying process in load-displacement measurement in accordance with the nanoindentation method, of the minimum load F, which is reached during an unloading process, is −0.06 or less (that is, the ratio of the maximum tensile force exerted by the sheet for sintering bonding 10 on the indenter drawn out of that sheet to the above maximum load is 0.06 or more) is suitable from the viewpoint of obtaining a high adhesive strength on the surface of the sheet for sintering bonding 10. From the viewpoint of obtaining a high adhesive strength on the surface of the sheet for sintering bonding 10, the ratio is preferably −0.065 or less. On the other hand, in the sheet for sintering bonding 10, a configuration in which the above ratio (F/F') is −0.2 or more (that is, the ratio of the maximum tensile force exerted by the sheet for sintering bonding 10 on the indenter drawn out of that sheet to the above maximum load is 0.2 or less) is suitable from the viewpoint of, in a case where, for example, the sheet for sintering bonding 10 is accompanied by a separating material such as a separator that covers the surface thereof, properly separating such a separating material from the sheet for sintering bonding 10 when necessary. With respect to the sheet for sintering bonding 10, from the viewpoint of ensuring such separability, the ratio is preferably −0.15 or more.

The sheet for sintering bonding 10, which is suited for obtaining a satisfactory adhesiveness, is suited for laminating and integrating a plurality thereof, and is thus suited for making a sheet for sintering bonding 10 with a predetermined thickness by going through such lamination and integration.

In addition, the sheet for sintering bonding 10, which is suited for obtaining a satisfactory adhesiveness, is suited for carrying out transfer of the material for sintering bonding to each chip C in the transfer step mentioned above in the process of producing a semiconductor device, that is, in the step for leaving the portions of the sheet for sintering bonding 10 that have been pressure-bonded to the chips C (semiconductor chips) on those chips C. That is, the sheet for sintering bonding 10 is suited for properly performing the transfer step mentioned above, in which the material for sintering bonding is collectively supplied to a plurality of semiconductor chips. Such a sheet for sintering bonding 10 is suited for realizing a satisfactory operational efficiency in the sintering process in the process of producing a semiconductor device comprising sintering bonding portions of semiconductor chips.

In addition, the sheet for sintering bonding 10, which is suited for obtaining a satisfactory adhesiveness, is suited for, in the temporary fixation step mentioned above in the process of producing a semiconductor device, that is, in the step for temporarily fixing a chip (a semiconductor chip) with the layer of the material for sintering bonding to a supporting substrate S, suppressing occurrence of position aberration in such a chip C to be temporarily fixed. It is preferable that position aberration of the chip C be suppressed in the temporary fixation step from the viewpoint of the efficiency of a series of the processes for sintering bonding. Accordingly, the sheet for sintering bonding 10 is suited for realizing a satisfactory operational efficiency in the sintering process in the process of producing a semiconductor device comprising sintering bonding portions of semiconductor chips.

As described above, the sheet for sintering bonding 10 is suited for being laminated and integrated, and is also suited for realizing a satisfactory operational efficiency in the sintering process in the process of producing a semiconductor device comprising sintering bonding portions of semiconductor chips.

In the sheet for sintering bonding 10, the hardness H, as determined from load-displacement measurement in accordance with the nanoindentation method, is preferably 0.02 to 0.1 GPa, more preferably 0.03 to 0.08 GPa, and more preferably 0.04 to 0.06 GPa. Such a configuration in the sheet for sintering bonding 10 is suitable from the viewpoint of ensuring a moderate hardness, and is helpful for obtaining a satisfactory adhesiveness. Specifically, with respect to the sheet for sintering bonding 10, from the viewpoint of ensuring a "hardness" sufficient for retaining the sheet shape thereof, the hardness H is preferably 0.02 GPa or more, more preferably 0.03 GPa or more, and more preferably 0.04 GPa or more. In addition, with respect to the sheet for sintering bonding 10, from the viewpoint of ensuring a "stiffness" sufficient for avoiding a situation where the sheet is broken due to the fragility thereof, the hardness H is preferably 0.1 GPa or less, more preferably 0.08 GPa or less, and more preferably 0.06 GPa or less.

In the sheet for sintering bonding 10, the hardness H (GPa) and the minimum load F (µN), as determined from load-displacement measurement in accordance with the nanoindentation method, preferably satisfy −6000≤F/H≤−200, as mentioned above. With respect to the sheet for sintering bonding 10, from the viewpoint of ensuring the separability mentioned above, the value of F/H is preferably −6000 or more, more preferably −4000 or more, more preferably −2000 or more, and more preferably −1500 or more, as described above. From the viewpoint of obtaining a satisfactory adhesiveness on the surface of the sheet for sintering bonding 10, the value of F/H is preferably −200 or less, more preferably −400 or less, and more preferably −600 or less, as described above.

As described above, the sheet for sintering bonding 10 is suited for being made with a good operational efficiency and is also suited for realizing a satisfactory operational efficiency in the sintering process in the process of producing a semiconductor device comprising sintering bonding portions of semiconductor chips.

The binder component of the sheet for sintering bonding 10 preferably comprises a thermally decomposable high molecular binder, as mentioned above. According to such a configuration, at a temperature for the temporary fixation mentioned above, for example, at 70° C., and in the temperature range close thereto, by utilizing the viscoelasticity of the thermally decomposable high molecular binder, the cohesive strength of the sheet for sintering bonding 10 or the layer of the material for sintering bonding 11 derived therefrom is likely to be ensured, and accordingly, the adhesive strength of the sheet for sintering bonding 10 or the layer of the material for sintering bonding 11 is likely to be ensured. As such, the present configuration is suitable from the viewpoint of, upon or after pressure-bonding bonding objects in a state where the layer of the material for sintering bonding 11 derived from the sheet for sintering bonding 10 intervenes between the bonding objects, suppressing occurrence of position aberration in these bonding objects.

The weight average molecular weight of the high molecular binder, such as a thermally decomposable high molecular binder, in the sheet for sintering bonding 10 is preferably 10000 or more, as mentioned above. Such a configuration is suitable from the viewpoint of ensuring the cohesive strength or adhesive strength of the sheet for sintering bonding 10 or the layer of the material for sintering bonding 11 derived therefrom by utilizing the viscoelasticity of the thermally decomposable high molecular binder.

The high molecular binder, such as a thermally decomposable high molecular binder, in the sheet for sintering bonding 10 preferably comprises a polycarbonate resin and/or an acrylic resin, as mentioned above. As mentioned above, in the process of using the sheet for sintering bonding 10 to realize sintering bonding, heating at high temperature for sintering bonding is carried out in a state where the bonding objects are temporarily fixed therebetween with the layer of the material for sintering bonding 11 derived from the sheet for sintering bonding 10. When the heating at high temperature for sintering bonding is carried out at, for example, 300° C. and in the temperature range including the vicinity thereof, a polycarbonate resin and an acrylic resin are easily provided as a high molecular binder that is decomposed and vaporized at a temperature of approximately 300° C. Accordingly, the present configuration is suitable from the viewpoint of reducing an organic residue in a sintered layer 12 formed between the bonding objects to be sintering-bonded using the sheet for sintering bonding 10. As the amount of the organic residue in the sintered layer 12 becomes smaller, that sintered layer 12 tends to be more rigid, and accordingly, high reliability for bonding is likely to be obtained in that sintered layer 12.

The low molecular binder in the sheet for sintering bonding 10 comprises a low boiling point binder having a boiling point lower than the thermal decomposition starting temperature of the thermally decomposable high molecular binder, as mentioned above. Such a configuration is suited for ensuring satisfactory tackiness in the sheet for sintering bonding 10, and is therefore suited for ensuring satisfactory adhesiveness to other members such as the chip C and the base material B. As such, the present configuration is suitable from the viewpoint of, upon or after pressure-bonding bonding objects in a state where the layer of the material for sintering bonding 11 derived from the sheet for sintering bonding 10 intervenes between the bonding objects, suppressing occurrence of position aberration in these bonding objects.

In the sheet for sintering bonding 10, the content of the sinterable particle is preferably 60 to 99% by mass, more preferably 65 to 98% by mass, and more preferably 70 to 97% by mass. Such a configuration is suitable from the viewpoint of attempting to make the density of the sintered layer 12 formed from the sheet for sintering bonding 10 higher.

EXAMPLES

Example 1

By using a hybrid mixer (trade name: "HM-500", manufactured by Keyence Corporation) at its stirring mode, 56.25 parts by mass of a silver particle as a sinterable particle $P_1$, 2.16 parts by mass of a polycarbonate resin as a high molecular binder (a thermally decomposable high molecular binder) (trade name: "QPAC 40", the weight average molecular weight is 150000, solid at ordinary temperature, manufactured by Empower Materials), 2.16 parts by mass of isobornyl cyclohexanol as a low molecular binder (a low boiling point binder) (trade name: "Terusolve MTPH", liquid at ordinary temperature, manufactured by NIPPON TERPENE CHEMICALS, INC.), and 39.43 parts by mass of methyl ethyl ketone as a solvent were mixed to prepare a varnish. The stirring time was set to be 3 minutes. The above silver particle as the sinterable particle $P_1$ comprises the first silver particle (the average particle diameter: 60 nm, manufactured by DOWA Electronics Materials Co., Ltd.) and the second silver particle (the average particle diameter: 1100 nm, manufactured by MITSUI MINING & SMELTING CO., LTD.) at a mass ratio of 9:1. Then, the obtained varnish was applied on a mold release film as a base material (trade name: "MRA 38", manufactured by Mitsubishi Chemical Corporation), and subsequently dried to form a sheet for sintering bonding with a thickness of 57 μm. The drying temperature was set to be 110° C., and the drying time was set to be 3 minutes. In the sheet for sintering bonding, the content of the sinterable particle is 92.9% by mass. As described above, the sheet for sintering bonding of Example 1, containing the sinterable particle, the high molecular binder and the low molecular binder, was made on the base material. The composition pertaining to the sheet for sintering bonding of Example 1 is reported in Table 1 (The same applies to Examples and Comparative Examples described below. In addition, in Table 1, the unit of each numerical value representing the composition is a relative "part by mass").

Example 2

A sheet for sintering bonding of Example 2 was made in the same manner as the sheet for sintering bonding of Example 1 except that the amount of the sinterable particle $P_1$ to be compounded was changed from 56.25 parts by mass to 56.98 parts by mass; the amount of the polycarbonate resin (trade name: "QPAC 40", manufactured by Empower Materials) to be compounded was changed from 2.16 parts by mass to 0.75 parts by mass; the amount of isobornyl cyclohexanol (trade name: "Terusolve MTPH", manufactured by NIPPON TERPENE CHEMICALS, INC.) to be compounded was changed from 2.16 parts by mass to 2.98 parts by mass; and the amount of methyl ethyl ketone to be used was changed from 39.4 parts by mass to 39.29 parts by mass. With respect to the sheet for sintering bonding of Example 2, the content of the sinterable particle is 93.9% by mass, and the thickness is 53 μm.

Example 3

A sheet for sintering bonding of Example 3 was made in the same manner as the sheet for sintering bonding of Example 1 except that the amount of the sinterable particle $P_1$ to be compounded was changed from 56.25 parts by mass to 56.03 parts by mass; the amount of the polycarbonate resin (trade name: "QPAC 40", manufactured by Empower Materials) to be compounded was changed from 2.16 parts by mass to 0.9 parts by mass; the amount of isobornyl cyclohexanol (trade name: "Terusolve MTPH", manufactured by NIPPON TERPENE CHEMICALS, INC.) to be compounded was changed from 2.16 parts by mass to 3.6 parts by mass; and the amount of methyl ethyl ketone to be used was changed from 39.43 parts by mass to 39.47 parts by mass. With respect to the sheet for sintering bonding of Example 3, the content of the sinterable particle is 92.6% by mass, and the thickness is 54 μm.

Example 4

A sheet for sintering bonding of Example 4 was made in the same manner as the sheet for sintering bonding of Example 1 except that 66.11 parts by mass of a copper particle as a sinterable particle $P_2$ (the average particle diameter: 200 nm, manufactured by MITSUI MINING & SMELTING CO., LTD.) was used instead of 56.25 parts by mass of the sinterable particle $P_1$; the amount of the polycarbonate resin (trade name: "QPAC 40", manufactured by Empower Materials) to be compounded was changed from 2.16 parts by mass to 3.57 parts by mass; the amount of isobornyl cyclohexanol (trade name: "Terusolve MTPH", manufactured by NIPPON TERPENE CHEMICALS, INC.) to be compounded was changed from 2.16 parts by mass to 5.35 parts by mass; and the amount of methyl ethyl ketone to be used was changed from 39.43 parts by mass to 24.97 parts by mass. With respect to the sheet for sintering bonding of Example 4, the content of the sinterable particle is 88.1% by mass, and the thickness is 68 μm.

Comparative Example 1

A sheet for sintering bonding of Comparative Example 1 was made in the same manner as the sheet for sintering bonding of Example 1 except that the amount of the sinterable particle $P_1$ to be compounded was changed from 56.25 parts by mass to 55.78 parts by mass; the amount of the polycarbonate resin (trade name: "QPAC 40", manufactured by Empower Materials) to be compounded was changed from 2.16 parts by mass to 4.72 parts by mass; isobornyl cyclohexanol (trade name: "Terusolve MTPH", manufactured by NIPPON TERPENE CHEMICALS, INC.) was not used; and the amount of methyl ethyl ketone to be used was changed from 39.43 parts by mass to 39.5 parts by mass. With respect to the sheet for sintering bonding of Comparative Example 1, the content of the sinterable particle is 92.2% by mass, and the thickness is 54 μm.

Comparative Example 2

A sheet for sintering bonding of Comparative Example 2 was made in the same manner as the sheet for sintering bonding of Example 1 except that the amount of the sinterable particle $P_1$ to be compounded was changed from 56.25 parts by mass to 56.69 parts by mass; the polycarbonate resin was not used; the amount of isobornyl cyclohexanol (trade name: "Terusolve MTPH", manufactured by NIPPON TERPENE CHEMICALS, INC.) to be compounded was changed from 2.16 parts by mass to 3.98 parts by mass; and the amount of methyl ethyl ketone to be used was changed from 39.43 parts by mass to 39.33 parts by mass. With respect to the sheet for sintering bonding of Comparative Example 2, the content of the sinterable particle is 93.4% by mass, and the thickness is 55 μm.

Comparative Example 3

A sheet for sintering bonding of Comparative Example 3 was made in the same manner as the sheet for sintering bonding of Example 1 except that the amount of the sinterable particle $P_1$ to be compounded was changed from 56.25 parts by mass to 64.73 parts by mass; the amount of the polycarbonate resin (trade name: "QPAC 40", manufactured by Empower Materials) to be compounded was changed from 2.16 parts by mass to 6.15 parts by mass; the amount of isobornyl cyclohexanol (trade name: "Terusolve MTPH", manufactured by NIPPON TERPENE CHEMICALS, INC.) to be compounded was changed from 2.16 parts by mass to 4.09 parts by mass; and the amount of methyl ethyl ketone to be used was changed from 39.43 parts by mass to 25.04 parts by mass. With respect to the sheet for sintering bonding of Comparative Example 3, the content of the sinterable particle is 86.3% by mass, and the thickness is 65 μm.

<Load-Displacement Measurement by Nanoindentation Method>

With respect to each of the sheets for sintering bonding (accompanied by the base material on one side) of Examples 1 to 4 and Comparative Examples 1 to 3, load-displacement measurement by the nanoindentation method was carried out by using a nanoindenter (trade name: "Triboindenter", manufactured by Hysitron, Inc.). The sample piece subjected to the measurement was provided by cutting each sheet for sintering bonding into a size of 10 mm square. In the present measurement, the measurement mode was single indentation measurement, the measurement temperature was 23° C., the indenter to be used was a Berkovich (trigonal pyramid) diamond indenter, the maximum load (set value), which is reached during the load applying process, was 500 μN, the indentation velocity of the indenter during the load applying process was 100 μN/sec, and the drawing velocity of the indenter during the unloading process was 100 μN/sec. The minimum load F (μN) determined in the measurement, the ratio (F/F') between the minimum load F (μN) and the maximum load F' (μN), the hardness H (GPa), and the value (F/H) obtained by dividing the minimum value F (μN) by the hardness H (GPa) are reported in Table 1.

<Sheet Adhesiveness>

With respect to each of the sheets for sintering bonding (accompanied by the base material on one side) of Examples 1 to 4 and Comparative Examples 1 to 3, the adhesiveness was examined as follows. At first, on the sheet for sintering bonding in the sheet for sintering bonding with a base material, five silicon chips with a size of 5 mm square (the thickness: 200 μm, an Ag plated film is formed on the side of the face to which the sheet for sintering bonding is to be closely adhered) were mounted in an array with an interval of 5 mm. The base material accompanying the sheet for sintering bonding is "MRA 38" (thickness: 38 μm) manufactured by Mitsubishi Chemical Corporation. Then, the sheet for sintering bonding with a base material accompanied by these silicon chips was passed through a laminater equipped with a pressure roller, thereby closely adhering the silicon chips to the sheet for sintering bonding (a pressure-bonding treatment). As a result of this, a laminated body of the base material, the sheet for sintering bonding thereon, and the silicon chips thereon was obtained. In this pressure-bonding treatment, the pressure by the pressure roller is 0.5 MPa, the velocity of the pressure roller is 10 mm/sec, the pressure-bonding temperature is 70° C. (Examples 1 to 3, and Comparative Examples 1 and 2) or 90° C. (Example 4 and Comparative Examples 3). After such a pressure-bonding treatment, the base material was separated from the above laminated body. Then, with regard to the adhesiveness of the sheet for sintering bonding, the case where the layer of the material for sintering bonding derived from the sheet for sintering bonding was left on all of the five silicon chips even after the separation of the base material was evaluated as "satisfactory", and the case where the layer of the material for sintering bonding derived from the sheet for sintering bonding was not left on all of or a part of the five silicon chips was evaluated as "unsatisfactory". The evaluation results are reported in Table 1.

[Evaluation]

The sheets for sintering bonding of Examples 1 to 5, having a minimum load F, as determined from load-displacement measurement in accordance with the nanoindentation method, in the range of −100 to −30 μN, exhibited a satisfactory adhesiveness in the test for evaluating the adhesiveness mentioned above.

TABLE 1

| | | Example 1 | Example 2 | Example 3 | Example 4 | Comparative Example 1 | Comparative Example 2 | Comparative Example 3 |
|---|---|---|---|---|---|---|---|---|
| Sinterable particle | $P_1$ (silver particle) | 56.25 | 56.98 | 56.03 | — | 55.78 | 56.69 | 64.73 |
| | $P_2$ (copper particle) | — | — | — | 66.11 | — | — | — |
| High molecular binder | Polycarbonate resin | 2.16 | 0.75 | 0.9 | 3.57 | 4.72 | — | 6.15 |
| Low molecular binder | Isobornyl cyclohexanol | 2.16 | 2.98 | 3.6 | 5.35 | — | 3.98 | 4.09 |
| Solvent used | Methyl ethyl ketone | 39.43 | 39.29 | 39.47 | 24.97 | 39.5 | 39.33 | 25.04 |
| Thickness of sheet for sintering bonding (μm) | | 57 | 53 | 54 | 68 | 54 | 55 | 65 |
| Minimum load F (μN) | | −39.2 | −44.9 | −50.1 | −35.3 | −14.1 | −109 | −24.5 |
| F/F' | | −0.079 | −0.089 | −0.102 | −0.067 | −0.023 | −0.215 | −0.053 |
| Hardness H (GPa) | | 0.055 | 0.048 | 0.043 | 0.03 | 0.108 | 0.108 | 0.13 |
| F/H | | −713 | −935 | −1165 | −1177 | −131 | −6056 | −188 |
| Sheet adhesiveness | | Satisfactory | Satisfactory | Satisfactory | Satisfactory | Unsatisfactory | Unsatisfactory | Unsatisfactory |

As a summary of the above, the configuration of the present invention and variations thereof will be enumerated as clauses below.

[Clause 1]

A sheet for sintering bonding, comprising an electrically conductive metal containing sinterable particle and a binder component, wherein the sheet has a minimum load, which is reached during an unloading process in load-displacement measurement in accordance with a nanoindentation method, of −100 to −30 μN.

[Clause 2]

A sheet for sintering bonding, comprising an electrically conductive metal containing sinterable particle and a binder component, wherein the sheet has a ratio of a minimum load, which is reached during an unloading process subsequent to a load applying process in load-displacement measurement in accordance with a nanoindentation method, to a maximum load, which is reached during the load applying process, of −0.2 to −0.06.

[Clause 3]

The sheet for sintering bonding according to clause 2, wherein the minimum load is −100 to −30 μN.

[Clause 4]

The sheet for sintering bonding according to any one of clauses 1 to 3, wherein a hardness H (GPa) and the minimum load F (μN), as determined from the load-displacement measurement in accordance with the nanoindentation method, satisfy −6000≤F/H≤−200.

[Clause 5]

The sheet for sintering bonding according to any one of clauses 1 to 4, wherein a hardness, as determined from the load-displacement measurement in accordance with the nanoindentation method, is 0.02 to 0.1 GPa.

[Clause 6]

The sheet for sintering bonding according to any one of clauses 1 to 5, wherein the binder component comprises a high molecular binder and/or a low molecular binder.

[Clause 7]

The sheet for sintering bonding according to clause 6, wherein the high molecular binder comprises a thermally decomposable high molecular binder.

[Clause 8]

The sheet for sintering bonding according to clause 6 or 7, wherein a weight average molecular weight of the high molecular binder is 10000 or more.

[Clause 9]

The sheet for sintering bonding according to any one of clauses 6 to 8, wherein the high molecular binder comprises a polycarbonate resin and/or an acrylic resin.

[Clause 10]

The sheet for sintering bonding according to any one of clauses 6 to 9, wherein the low molecular binder comprises a low boiling point binder having a boiling point lower than a thermal decomposition starting temperature of the high molecular binder.

[Clause 11]

The sheet for sintering bonding according to any one of clauses 6 to 10, wherein a proportion between the high molecular binder and the low molecular binder (high molecular binder/low molecular binder) is 0.1 or more, preferably 0.15 or more, and more preferably 0.2 or more.

[Clause 12]

The sheet for sintering bonding according to any one of clauses 6 to 11, wherein a proportion between the high molecular binder and the low molecular binder (high molecular binder/low molecular binder) is 1.4 or less, preferably 1.3 or less, more preferably 1.2 or less, and further preferably 1.1 or less.

[Clause 13]

The sheet for sintering bonding according to any one of clauses 1 to 12, wherein the sinterable particle comprises at least one selected from the group consisting of a silver particle, a copper particle, a silver oxide particle and a copper oxide particle.

[Clause 14]

The sheet for sintering bonding according to any one of clauses 1 to 13, wherein a content of the sinterable particle is 60 to 99% by mass, preferably 65 to 98% by mass, and more preferably 70 to 97% by mass.

[Clause 15]

A sheet for sintering bonding with a base material, having a laminated structure comprising a base material and the sheet for sintering bonding according to any one of clauses 1 to 14.

REFERENCE SIGNS LIST

X Sheet body
B Base material
10 Sheet for sintering bonding
11 Layer of material for sintering bonding
12 Sintered layer
T1, T2 Tape for processing
C Chip (semiconductor chip)
S Supporting substrate (substrate)

The invention claimed is:
1. A sheet for sintering bonding, comprising:
an electrically conductive metal containing sinterable particle; and
a binder component,
wherein:
the binder component comprises a high molecular binder and a low molecular binder, the high molecular binder is a thermally decomposable binder and the low molecular binder has a molecular weight of 500 or less;
the proportion between the high molecular binder and the low molecular binder, high molecular binder/low molecular binder, is 0.1 to 1.4;
a content of the high molecular binder contained in the sheet for sintering bonding is 0.1 to 7% by mass;
the sheet has a minimum load, which is reached during an unloading process in load-displacement measurement in accordance with a nanoindentation method, of −100 to −30 μN; and
the nanoindentation method is carried out by using a nanoindenter under the following conditions:
the measurement mode is single indentation measurement,
the measurement temperature is 23° C.,
the indenter to be used is a Berkovich, trigonal pyramid, diamond indenter,
the set value of the maximum load which is reached during the load applying process is 500 μN,
the indentation velocity of the indenter during the load applying process is 100 μN/sec, and
the drawing velocity of the indenter during the unloading process is 100 μN/sec.

2. A sheet for sintering bonding, comprising:
an electrically conductive metal containing sinterable particle; and
a binder component,
wherein:
the binder component comprises a high molecular binder and a low molecular binder, the high molecular binder is a thermally decomposable binder and the low molecular binder has a molecular weight of 500 or less;
the proportion between the high molecular binder and the low molecular binder, high molecular binder/low molecular binder, is 0.1 to 1.4;
a content of the high molecular binder contained in the sheet for sintering bonding is 0.1 to 7% by mass;
the sheet has a ratio of a minimum load, which is reached during an unloading process subsequent to a load applying process in load-displacement measurement in accordance with a nanoindentation method, to a maximum load, which is reached during the load applying process, of −0.2 to −0.06; and
the nanoindentation method is carried out by using a nanoindenter under the following conditions:
the measurement mode is single indentation measurement,
the measurement temperature is 23° C.,
the indenter to be used is a Berkovich, trigonal pyramid, diamond indenter,
the set value of the maximum load which is reached during the load applying process is 500 μN,
the indentation velocity of the indenter during the load applying process is 100 μN/sec, and
the drawing velocity of the indenter during the unloading process is 100 μN/sec.

3. The sheet for sintering bonding according to claim 2, wherein the minimum load is −100 to −30 μN.

4. The sheet for sintering bonding according to claim 1, wherein a hardness H (GPa) and the minimum load F (μN), as determined from the load-displacement measurement in accordance with the nanoindentation method, satisfy $-6000 \leq F/H \leq -200$.

5. The sheet for sintering bonding according to claim 2, wherein a hardness H (GPa) and the minimum load F (μN), as determined from the load-displacement measurement in accordance with the nanoindentation method, satisfy $-6000 \leq F/H \leq -200$.

6. The sheet for sintering bonding according to claim 3, wherein a hardness H (GPa) and the minimum load F (μN), as determined from the load-displacement measurement in accordance with the nanoindentation method, satisfy $-6000 \leq F/H \leq -200$.

7. The sheet for sintering bonding according to claim 1, wherein a hardness, as determined from the load-displacement measurement in accordance with the nanoindentation method, is 0.02 to 0.1 GPa.

8. The sheet for sintering bonding according to claim 2, wherein a hardness, as determined from the load-displacement measurement in accordance with the nanoindentation method, is 0.02 to 0.1 GPa.

9. The sheet for sintering bonding according to claim 3, wherein a hardness, as determined from the load-displacement measurement in accordance with the nanoindentation method, is 0.02 to 0.1 GPa.

10. The sheet for sintering bonding according to claim 4, wherein a hardness, as determined from the load-displacement measurement in accordance with the nanoindentation method, is 0.02 to 0.1 GPa.

11. The sheet for sintering bonding according to claim 5, wherein a hardness, as determined from the load-displacement measurement in accordance with the nanoindentation method, is 0.02 to 0.1 GPa.

12. The sheet for sintering bonding according to claim 6, wherein a hardness, as determined from the load-displacement measurement in accordance with the nanoindentation method, is 0.02 to 0.1 GPa.

13. A laminated structure comprising a base material and the sheet for sintering bonding according to claim 1.

14. A laminated structure comprising a base material and the sheet for sintering bonding according to claim 2.

15. A laminated structure comprising a base material and the sheet for sintering bonding according to claim 3.

16. A laminated structure comprising a base material and the sheet for sintering bonding according to claim 4.

17. A laminated structure comprising a base material and the sheet for sintering bonding according to claim 5.

18. A laminated structure comprising a base material and the sheet for sintering bonding according to claim 6.

19. A laminated structure comprising a base material and the sheet for sintering bonding according to claim 7.

20. A laminated structure comprising a base material and the sheet for sintering bonding according to claim 8.

\* \* \* \* \*